(12) United States Patent
Jo et al.

(10) Patent No.: US 10,193,660 B2
(45) Date of Patent: Jan. 29, 2019

(54) HEADER PROCESSING DEVICE, PROCESSOR, AND ELECTRONIC DEVICE

(71) Applicant: SAMSUNG ELECTRONICS CO., LTD., Suwon-si, Gyeonggi-do (KR)

(72) Inventors: Woon Yong Jo, Seoul (KR); Dae Keon Park, Hwaseong-si (KR); June Hee Lee, Yongin-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 1 day.

(21) Appl. No.: 15/428,347

(22) Filed: Feb. 9, 2017

(65) Prior Publication Data

US 2018/0026748 A1   Jan. 25, 2018

(30) Foreign Application Priority Data

Jul. 20, 2016 (KR) ........................ 10-2016-0091867

(51) Int. Cl.
*H04L 1/00* (2006.01)
*H03M 13/09* (2006.01)
*H04L 29/06* (2006.01)
*H04L 29/08* (2006.01)

(52) U.S. Cl.
CPC ........ *H04L 1/0061* (2013.01); *H03M 13/096* (2013.01); *H04L 67/12* (2013.01); *H04L 69/22* (2013.01)

(58) Field of Classification Search
CPC .................................................... H04L 7/048
USPC ................. 714/776, 753, 746, 762
See application file for complete search history.

(56) References Cited

U.S. PATENT DOCUMENTS

| | | | |
|---|---|---|---|
| 6,055,663 A * | 4/2000 | Vogel | H04L 1/0083 375/E7.28 |
| 6,941,179 B2 | 9/2005 | Takemoto et al. | |
| 6,976,075 B2 | 12/2005 | Ma | |
| 7,215,662 B1 | 5/2007 | Lim et al. | |
| 8,423,669 B2 | 4/2013 | Matsuhira | |
| 8,848,681 B2 | 9/2014 | Maheshwari et al. | |
| 9,838,685 B2 * | 12/2017 | Yu | H04N 19/174 |
| 2005/0163275 A1 | 7/2005 | Yamada et al. | |
| 2006/0265227 A1 | 11/2006 | Sadamura et al. | |
| 2008/0117932 A1 * | 5/2008 | Daniel | H04L 69/22 370/474 |
| 2012/0224473 A1 | 9/2012 | Furuichi | |
| 2013/0336399 A1 * | 12/2013 | Yu | H04N 19/70 375/240.14 |
| 2015/0146729 A1 * | 5/2015 | Babu | H04L 69/22 370/392 |
| 2015/0280746 A1 * | 10/2015 | Sikkink | H03M 13/17 714/762 |

FOREIGN PATENT DOCUMENTS

JP           09-181728 A        7/1997

* cited by examiner

*Primary Examiner* — Fritz Alphonse
(74) *Attorney, Agent, or Firm* — Lee & Morse P.C.

(57) ABSTRACT

A header processing device includes an error detector, a controller, and a reallocator. The error detector detects an error in a header in a packet and outputs a header error detection result. The controller selects first and second information from the header based on information corresponding to a type of the header and the header error detection result. The reallocator merges the first and second information and generates a header with a common format different from a format of the header.

18 Claims, 10 Drawing Sheets

HEADER PROCESSING DEVICE, PROCESSOR, AND ELECTRONIC DEVICE

CROSS-REFERENCE TO RELATED APPLICATION

Korean Patent Application No. 10-2016-0091867, filed on Jul. 20, 2016, and entitled, "Header Processing Device, Processor, and Electronic Device," is incorporated by reference herein in its entirety.

BACKGROUND

1. Field

One or more embodiments described herein relate to a header processing device, a processor, and an electronic device.

2. Description of the Related Art

The Mobile Industry Processor Interface Alliance (The MIPI® Alliance) has been established to define interface standards for mobile devices. According to MIPI specifications, transmitter link layers generate headers and error check information for transmitting data received from an upper layer. The headers and error check information are attached to data in packets. The packets are transmitted to receivers through transmitter physical layers. Receiver link layers receive the packets transmitted through receiver physical layers, and transmit reliable data to upper layers based on headers and error check information in the packet.

The headers may include information to test the validity of the information in the packets, along with information to process the data. Since the format of the headers is determined based on properties of the physical layers, the format may differ depending on the types of physical layers. In this case, transmitter and receiver link layers include several link paths to process headers in different formats. However, some of the modules may perform same or duplicate functions. This increases chip size.

SUMMARY

In accordance with one or more embodiments, a header processing device includes an error detector to detect an error in a header in a packet and output a header error detection result; a controller to select first information and second information from the header based on information corresponding to a type of the header and the header error detection result; and a reallocator to merge the first and second information and generate a header with a common format different from a format of the header.

In accordance with one or more other embodiments, a header processing device includes an error detector is to detect an error in a header of a first packet including a D-PHY header and of a second packet including a C-PHY header and to output a header error detection result; a controller to select a data ID and packet data field information in which an error in the header is not detected in each of the D-PHY header and the C-PHY header, the controller to select the data ID and packet data field information based on information corresponding to a type of header in the first packet and the second packet and the header error detection result; and a reallocator to merge the data ID and the packet data field information selected by the controller and to generate a header having a common format.

In accordance with one or more other embodiments, a processor includes a first physical layer to receive a first packet with a first header; a second physical layer to receiving a second packet with a second header; a link layer to convert the first header and the second header in the first packet and the second packet, respectively, to a third header, the link layer to output data through parsing and data interleaving of the third header; and a core processor to process the data output by the link layer.

In accordance with one or more other embodiments, an electronic device includes at least one sensor to generate and transmit a first packet including a first header or a second packet including a second header; and a processor to receive the first packet and the second packet, convert the first header and the second header to a third header, and process a third packet including the third header.

In accordance with one or more other embodiments, an apparatus includes first logic to receive a first packet with a first header format; second logic to receive a second packet with a second header format; third logic to generate a third header format based on the first header format and the second header format; and fourth logic to output third and fourth packets including the third header format with data in the first and second packets respectively, the first header format different from the second header format and the third header format different from the first and second header formats.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
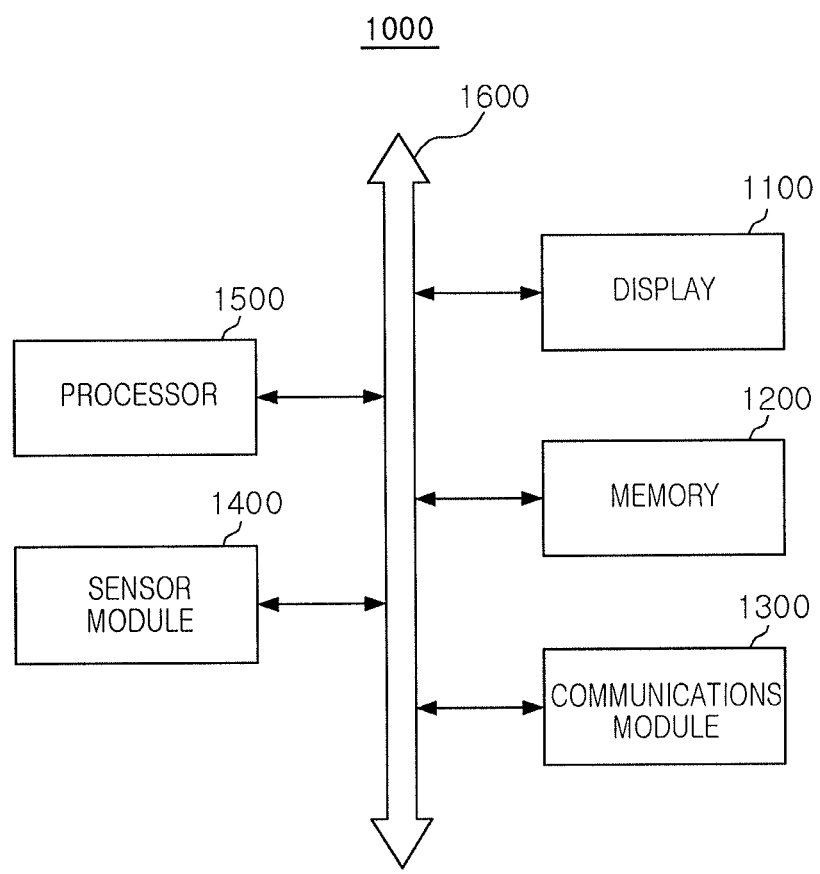
FIG. 1 illustrates an embodiment of an electronic device.

FIG. 1 illustrates an embodiment of an electronic device 1000 to which a header processing device may be applied. The electronic device 1000 may include a display device 1100, a memory 1200, a communications module 1300, a sensor module 1400, and a processor 1500. The electronic device 1000 may be or include, for example, a television, a desktop computer, or a mobile device such as but not limited to a smartphone, a tablet PC, or a laptop computer.

The display device 1100, the memory 1200, the communications module 1300, the sensor module 1400, the processor 1500, and/or other features of the electronic device 1000 may communicate with each other through a bus 1600 that transmits data.

Figure 2:
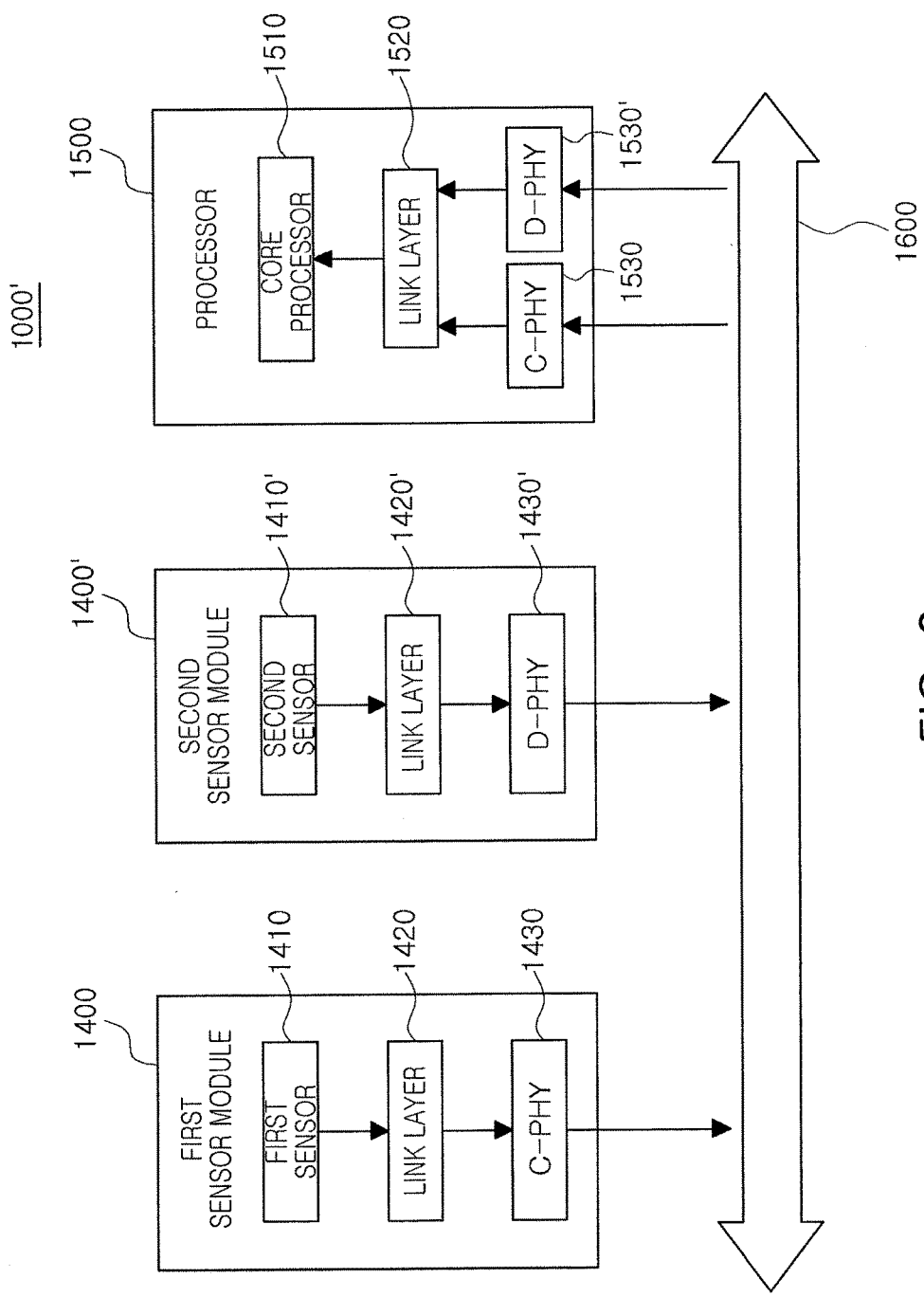
FIG. 2 illustrates another embodiment of an electronic device.

FIG. 2 illustrates another embodiment of an electronic device 1000' to which a header processing device. Referring to FIG. 2, an electronic device may include a first sensor module 1400, a second sensor module 1400', and a processor 1500. Each of the first sensor module 1400 and the second sensor module 1400' may generate and transmit data to the processor 1500. In one embodiment, each of the first sensor module 1400 and the second sensor module 1400' may transmit data generated by a first sensor 1410 and a second sensor 1410' to the processor 1500 through link layers 1420 and 1420' and physical layers 1430 and 1430'.

The first sensor 1410 and the second sensor 1410' may configure an upper layer and may be image sensors. The first sensor 1410 and the second sensor 1410' may generate and provide image signals to the link layers 1420 and 1420', which may be lower layers. The link layers 1420 and 1420' may connect the upper layer to a physical layer. The link layers 1420 and 1420' may receive data (e.g., image signals) from the first sensor 1410 and the second sensor 1410' (e.g., upper layers) and may generate a header and error check information (e.g., a cyclic redundancy check (CRC) checksum) to be appended to the data in a packet.

The physical layers 1430 and 1430' may serve an interface between the first sensor module 1400 and the bus 1600 and between the second sensor module 1400' and the bus 1600, and thus may serve as a transmission medium. The Mobile Industry Processor Interface Alliance (The MIPI® Alliance) defines D-PHY, C-PHY, and M-PHY as the physical layer. D-PHY and C-PHY may be used to transmit and receive media data. M-PHY may be used to transmit and receive data with a memory. In FIG. 2, C-PHY 1430 is used in the first sensor module 1400 and D-PHY 1430' is used in the second sensor module 1400'. The packet generated by the link layers 1420 and 1420' may be transmitted to the processor 1500 through the physical layers 1430 and 1430' and the bus 1600.

The processor 1500 may receive packets transmitted from the first sensor module 1400 and the second sensor module 1400' and extract reliable data based on the header and the error check information in the packet to process the data. The processor 1500 may include physical layers 1530 and 1530', a link layer 1520, and a core processor 1510.

In one embodiment, the processor 1500 may include an entirety of C-PHY 1530 and D-PHY 1530' as the physical layer, in order to receive the packet from the first sensor module 1400 using C-PHY 1430 and the second sensor module 1400' using D-PHY 1430'. The link layer 1520 may extract reliable data using the header and the error check information in the packet received through C-PHY 1530 and D-PHY 1530' to transmit the data to the upper layer. The core processor 1510 may configure the upper layer and may process the data received from the link layer 1520.

Figure 3:
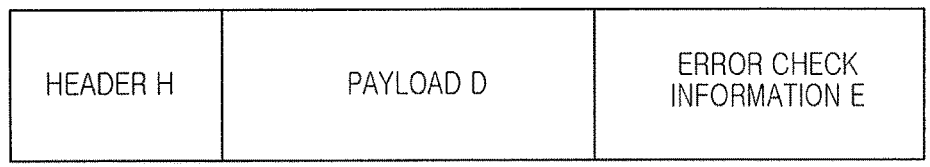
FIG. 3 illustrates an example of a packet.

FIG. 3 illustrates an embodiment of a packet transmitted among respective components of an electronic device, which, for example, may be electronic device 1000' in FIG. 2. Referring to FIG. 3, a packet P may include a header H, a payload D, and error check information E. The header H may be generated in transmitter link layers 1420 and 1420', as described above. The format of the header H may be different depending on type of a transmitted physical layer. For example, since a first sensor module 1400 transmits packets through C-PHY 1430 and a second sensor module 1400' transmits packets through D-PHY 1430', headers in these packets may have different formats.

Figure 4:
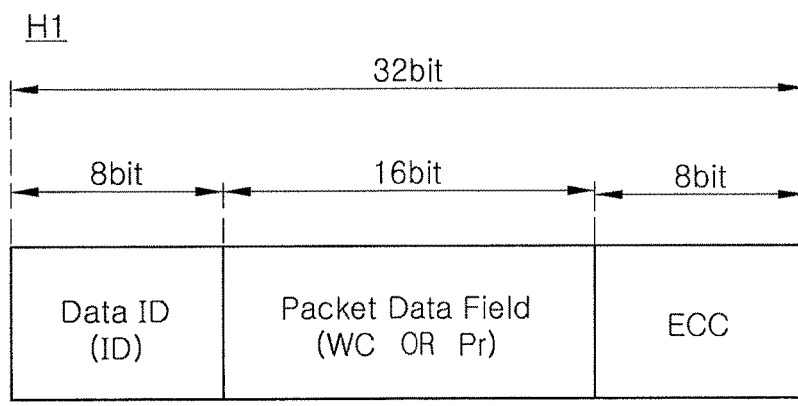
FIG. 4 illustrates an embodiment of a D-PHY header in the packet.

FIG. 4 illustrates an embodiment of a D-PHY header in the packet of FIG. 3. Referring to FIG. 4, D-PHY header H1 in a packet transmitted through D-PHY may include or consist of the following 4 bytes: 8-bit data identification field ID, 16-bit packet data field WC or Pr, and 8-bit error correction code ECC. The packet data field WC or Pr may include word count or parameter information. For example, when D-PHY includes 4 data lanes, 4 bytes comprising the D-PHY header H1 may be divided into 1 byte to be received through respective data lanes.

Figure 5:
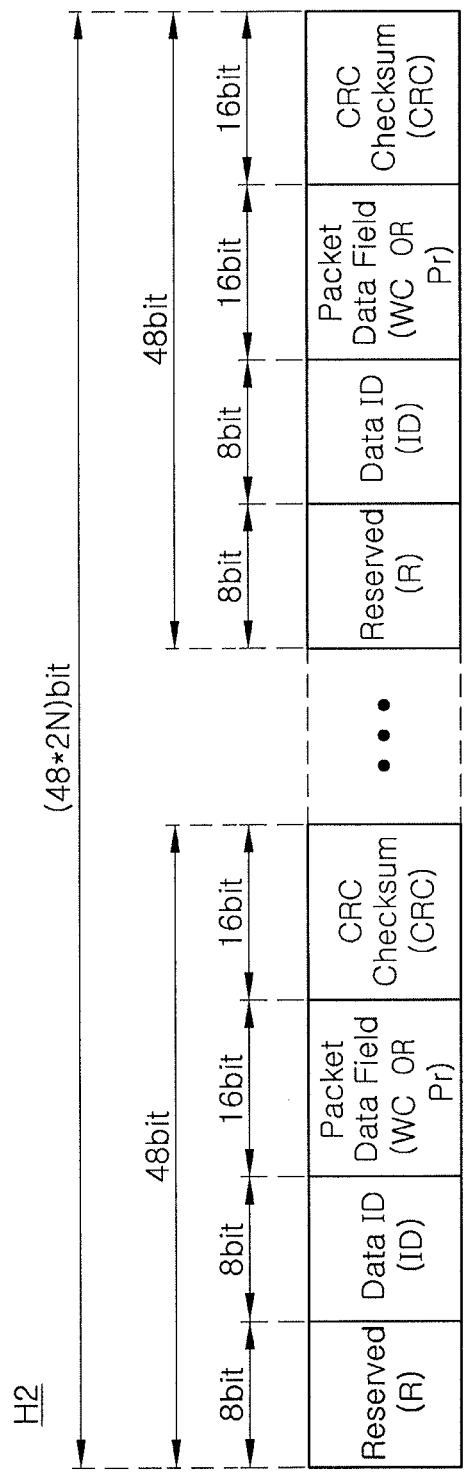
FIG. 5 illustrates an embodiment of a C-PHY header.

FIG. 5 illustrates an embodiment of a C-PHY header in the packet in FIG. 3. Referring to FIG. 5, a C-PHY header H2 in the packet transmitted through C-PHY may have a form in which 2N 6-byte unit headers (including 8-bit reserved field R, 8-bit data identification field ID, 16-bit packet data field WC or Pr, and 16-bit CRC checksum field) are duplicated, where N refers to the number of data lanes configuring C-PHY. For example, when C-PHY consists of 3 data lanes, the C-PHY header may have a form in which 6 6-byte unit headers described above are duplicated. In addition, 2 unit headers may be received in sequence through respective data lanes.

Figure 6:
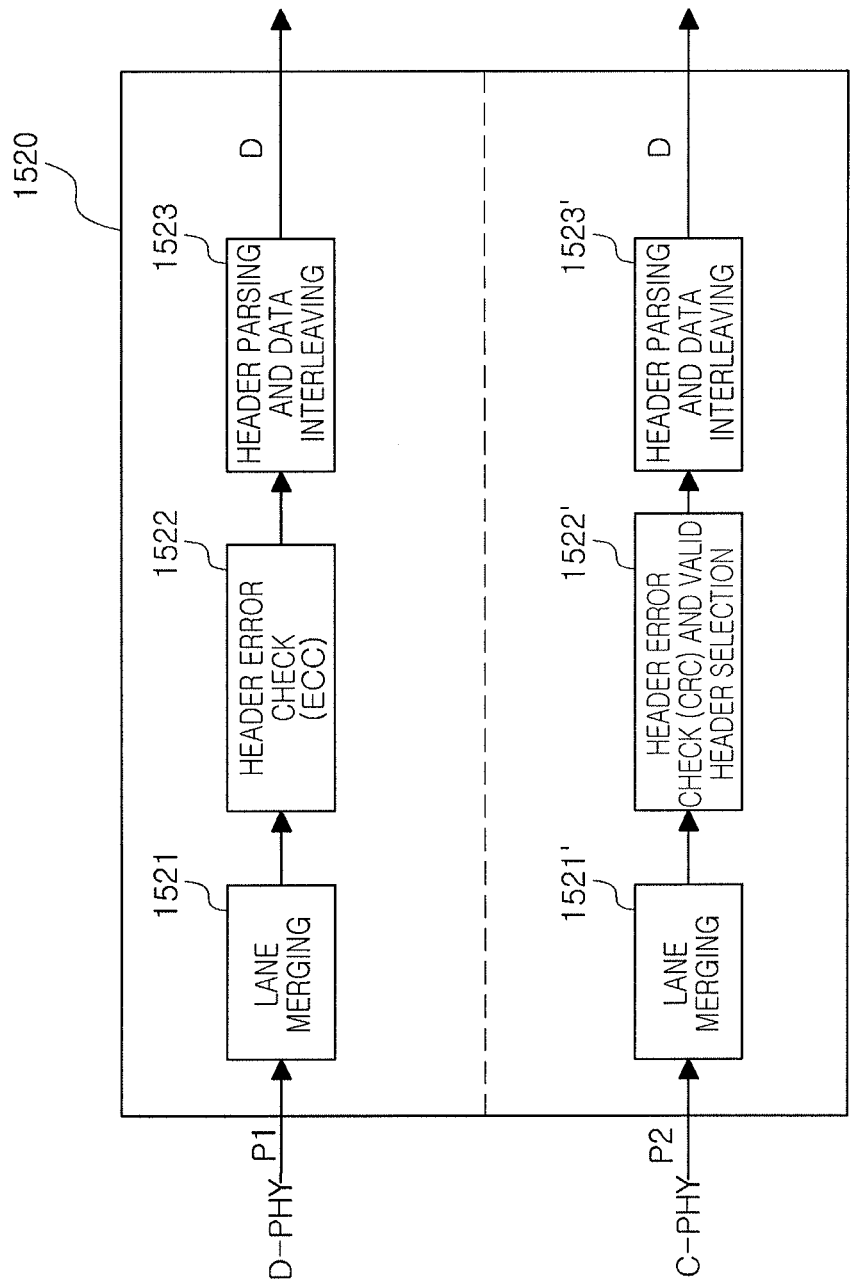
FIG. 6 illustrates a layer for processing headers with different formats.

FIG. 6 illustrates an example of a receiver link layer processing headers with different formats. When a physical layer includes D-PHY and C-PHY, a D-PHY header H1 and a C-PHY header H2 may have different formats, as described above. Therefore, a link layer 1520 may include paths to process the D-PHY header H1 and the C-PHY header H2. In the case of D-PHY, when 1 bit or less of an error occurs, a header including an ECC may be used for header error check. In the case of C-PHY, when 2 bits or more of an error occurs, a header including a plurality of CRC checksums may be used for header error check.

Therefore, a path to process a D-PHY header may be configured to check an error in a header 1522 using ECC. A path to process a C-PHY header may be configured in such a manner that an error in each unit header is checked using the plurality of CRC checksums, and information regarding a valid unit header without error is selected 1522'. However, the remainder of the composition, not including the header error check in the two paths (e.g., lane merging 1521 and 1521'), header parsing and data interleaving 1523 and 1523' may perform the same function. When a link layer is configured as in FIG. 6, a chip size may increase since modules performing the same function may be duplicated modules.

Figure 7:
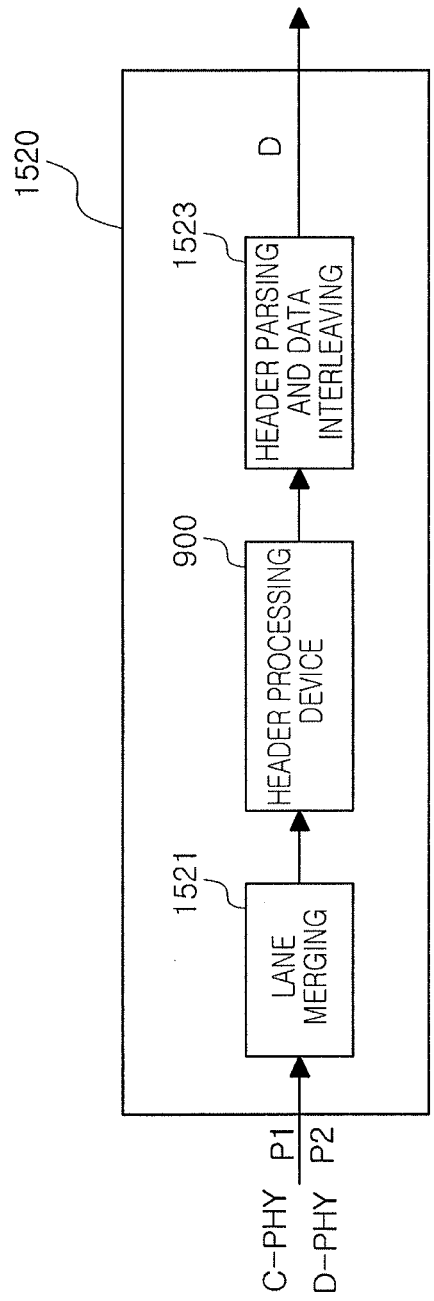
FIG. 7 illustrates another embodiment of a receiver link layer.

FIG. 7 illustrates an embodiment of a receiver link layer to which a header processing device is applied. Referring to FIG. 7, a link layer 1520 may include a header processing device 900 for processing headers with different formats through a single link path. For example, lane merging 1521 may merge data transmitted through a plurality of data lanes configuring a physical layer (e.g., D-PHY and C-PHY) and may transmit the data to the header processing device 900. The header processing device 900 may convert headers with different formats (e.g., D-PHY header H1 and a C-PHY header H2) to a header H3 having a common header to output. Therefore, header parsing and data interleaving 1523 may transmit the data to a core processor 1510 (an upper layer) through parsing and data interleaving of the header H3 having a common format.

According to the present example embodiment, data including headers with different formats may be processed through the single link path in such a manner that the header processing device 900 is applied thereto.

Figure 8:
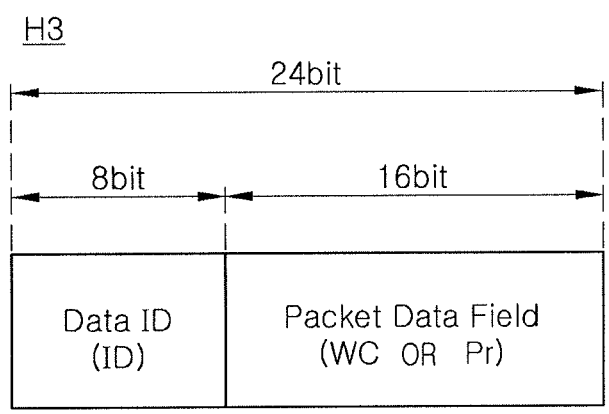
FIG. 8 illustrates an embodiment of a converted header.

FIG. 8 illustrates an embodiment of a header converted by a header processing device 900 corresponding to FIG. 7. The header processing device 900 may select data identification ID and packet data field information WC or Pr (which is information in both a D-PHY header H1 and a C-PHY header H2) with a structure described above, to thereby generate a header H3 having a common format as in FIG. 8.

In the case of a D-PHY header, an error in the D-PHY header may be checked using an ECC in the D-PHY header. When an error in the header is not detected, data identification field and packet data field information may be selected to generate the header H3 having a common format as in FIG. 8.

In the case of a C-PHY header, an error in the header may be checked using a CRC checksum of respective 2N unit headers in the C-PHY header. When the error is not detected in at least one unit header, data identification field and packet data field information of the unit header may be selected to generate the header H3 having a common format as in FIG. 8.

Figure 9:
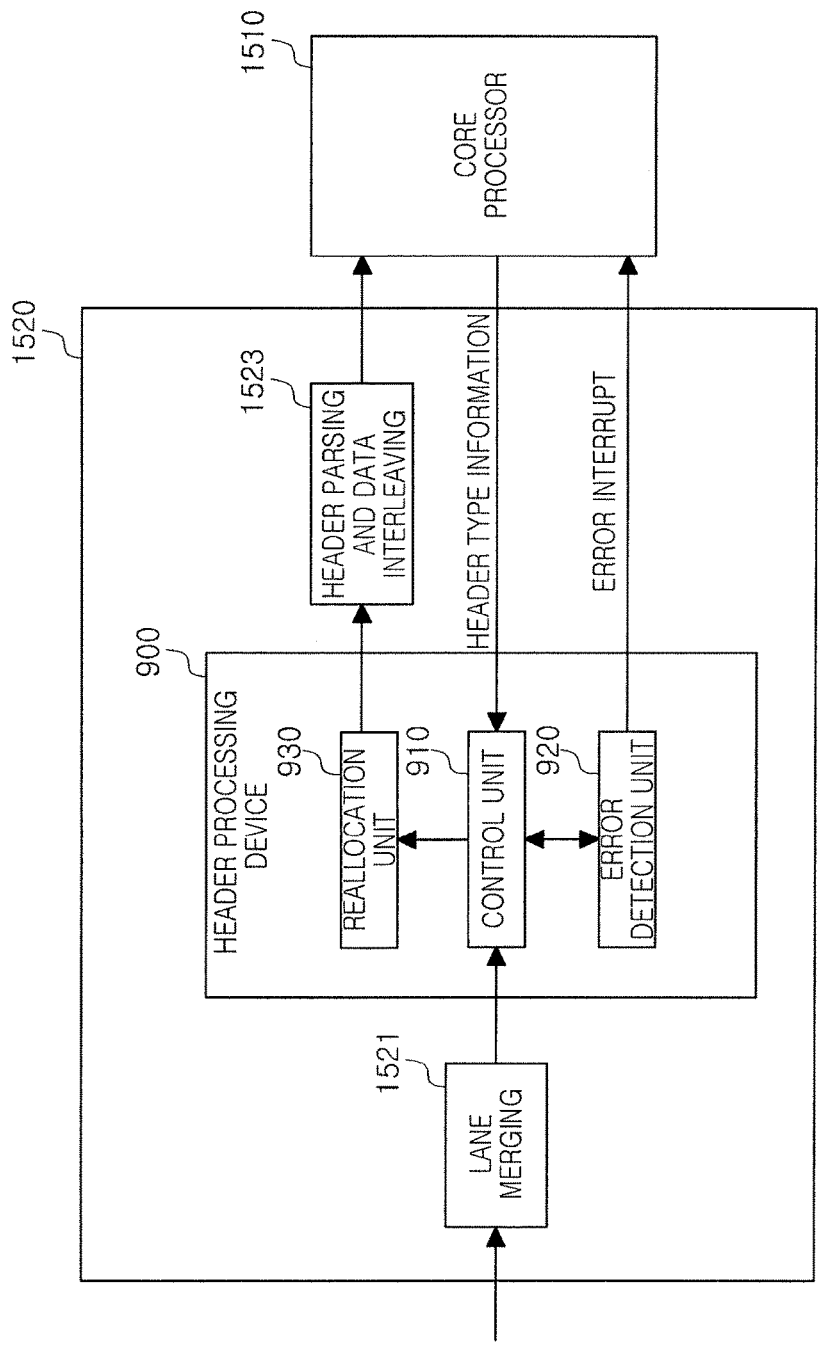
FIG. 9 illustrates an embodiment of a header processing device.

FIG. 9 illustrates an embodiment of the header processing device 900 which may receive a packet including headers with different formats (e.g., a D-PHY header and a C-PHY header) and which may extract first information and second information from the headers in the packet, which are to be converted to headers having a common format.

Referring to FIG. 9, the header processing device 900 may include a control unit 910, an error detection unit 920, and a reallocation unit 930. The control unit 910 may select the first information and the second information from a received packet based on information regarding a type of header in the received packet and a header error detection result output by the error detection unit 920. The control unit 910 may receive the information regarding a type of header from a core processor 1510.

Figure 10:
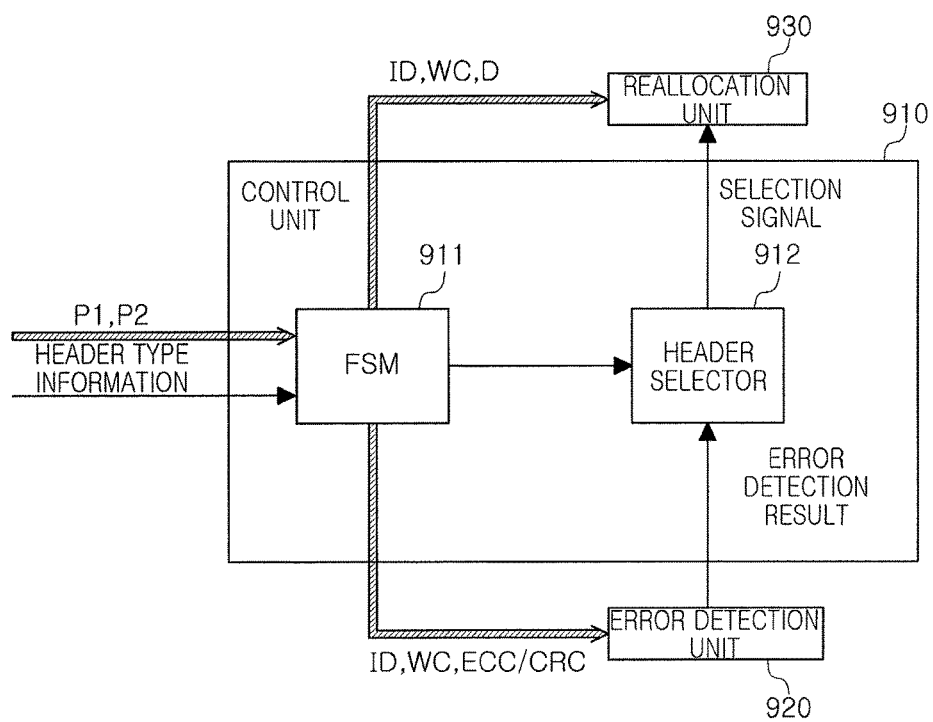
FIG. 10 illustrates an embodiment of a control unit.

FIG. 10 illustrates an embodiment of the control unit 910 in FIG. 9. The control unit 910 may include a finite state machine FSM 911 and a header selector 912. FSM 911 may transmit at least a portion of a header and data in a received packet to an error detection unit 920 and a reallocation unit 930 based on information regarding a type of header received from a core processor 1510. The received packet may include a D-PHY header or a C-PHY header. In addition, FSM 911 may receive information regarding the type of header in a packet received from the core processor 1510 and may transmit appropriate data to the error detection unit 920 and the reallocation unit 930 based on the information.

The header in the received packet (which includes, for example, a data identification ID, packet data field information WC or Pr, and an ECC/CRC checksum) may be transmitted to the error detection unit 920. Therefore, an error in a header may be checked by the error detection unit 920. In addition, data identification ID, packet data field information WC or Pr, and payload data D may be transmitted to the reallocation unit 930. Therefore, the reallocation unit 930 may allow the D-PHY header or the C-PHY header to be converted to a third header with a common format, thus being output.

As described above, FSM 911 may allow the appropriate data to be transmitted to the error detection unit 920 and reallocation unit 930 according to the type of header. In one embodiment, FSM 911 may be substituted with logic performing same functions.

The header selector 912 may receive a header error detection result from the error detection unit 920. Based on the result, the header selector 912 may generate a selection signal of first information and second information to provide to the reallocation unit 930. The first information may be provided as data identification ID. The second information may be provided as word count WC in a packet data field.

In the case of the D-PHY header, when an error in a header is not detected by the error detection unit 920, the header selector 912 may generate a signal for selecting data identification ID and word count WC to provide to the reallocation unit 930.

In the case of the C-PHY header, the header selector 912 may generate the signal for selecting data identification ID and word count WC of a unit header, in which the header error is not detected by the error detection unit 920 among 2N unit headers in the C-PHY header. The heater selector 912 may provide the signal to an input unit 931 and a second input unit 932 of the reallocation unit 930.

The error detection unit 920 may detect an error in the header of a packet including the D-PHY header and the C-PHY header and output the error detection result. The error detection unit 920 may perform functions to detect error in the header using the ECC and CRC checksum. The error detection unit 920 may detect the header error using the ECC or CRC checksum based on data from the control unit 910.

When error in the D-PHY header is detected or error is detected in all of the unit headers in the C-PHY header, by the error detection unit 920, the error detection unit 920 may transmit an error interrupt to the core processor 1510.

When error in the D-PHY header is not detected by the error detection unit 920 or error is not detected in at least one unit header in the C-PHY header, the error detection unit 920 may transmit the error detection result to the header selector 912 of the control unit 910.

The reallocation unit 930 may merge the first and second information, selected based on the selection signal provided by the control unit 910, to generate a header having a common header. The reallocation unit 930 may output data including the header with a common header to header parsing and data interleaving logic 1523.

Figure 11:
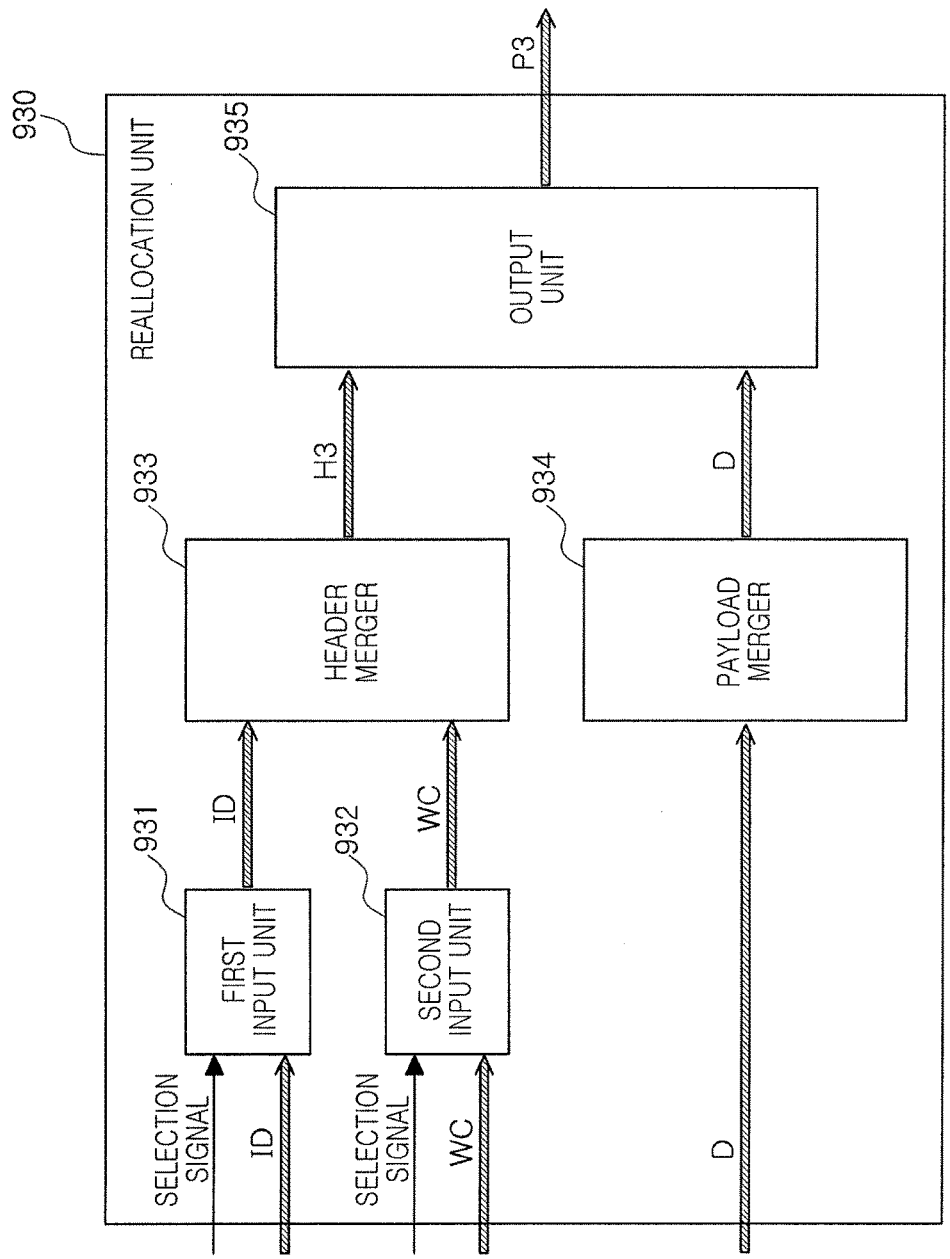
FIG. 11 illustrates an embodiment of a reallocation unit.

FIG. 11 illustrates an embodiment of the reallocation unit 930 in FIG. 9. Referring to FIG. 11, the reallocation unit 930 may include a first input unit 931, a second input unit 932, a header merger 933, a payload merger 934, and an output unit 935. The first input unit 931 may receive at least one data identification ID and may output data identification ID selected according to a selection signal from a header selector 912, to the header merger 933. The second input unit 932 may receive at least one word count WC and may output word count WC selected according to the selection signal from the header selector 912, to the header merger 933. In this case, the first input unit 931 and the second input unit 932 may implemented, for example, as a multiplexer for selecting and outputting at least one of a plurality of input signals.

The header merger 933 may merge first and second information, respectively output from the first input unit 931 and the second input unit 932, to generate and output a header H3 having a common format.

The payload merger 934 may receive data D and may merge and output data D.

The output unit 935 may merge the header H3 having a common format and data D, respectively output from the header merger 933 and the payload merger 934, to be output. In the example embodiment described above, the header processing device 900 may be applied to a processor 1500. Respective components in the electronic device 1000 in FIG. 1 (e.g., display device 1100, memory 1200, communications module 1300, and sensor module 1400) may also perform the function of receiving data. In this case, the header processing device 900 may be applied to a module.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods described herein.

The processors, parsers, sensor or other modules, state machines, correctors, mergers, checkers, selectors, reallocation, control, detection and other units and other processing features implemented by or associated with the layers may be implemented in logic which, for example, may include hardware, software, or both. When implemented at least partially in hardware, the processors, parsers, sensor or other modules, state machines, correctors, mergers, checkers, selectors, reallocation, control, detection and other units and other processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the processors, parsers, sensor or other modules, state machines, correctors, mergers, checkers, selectors, reallocation, control, detection and other units and other processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein. The processors described herein may also be or replaced by controllers.

In accordance with one or more of the aforementioned embodiments, a header processing device may allow headers with different formats to be converted to headers having a new common format, and may allow a packet including the headers having a new common format to be processed in a single link path. Therefore, several link paths may not be used for processing the headers with different formats, and modules performing the same functions are not included as duplicated modules. As a result, chip size may be reduced.

Example embodiments have been disclosed herein, and although specific terms are employed, they are used and are to be interpreted in a generic and descriptive sense only and not for purpose of limitation. The embodiments (or portions thereof) may be combined to form additional embodiments. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present embodiments as set forth in the following claims.

What is claimed is:

1. A header processing device, comprising:
    an error detector to detect an error in a header in a packet and output a header error detection result, the header in the packet including a first type header including an error correction code (ECC) or a second type header including a cyclic redundancy checking (CRC) checksum;
    a controller to extract first information and second information from the header based on information corresponding to a type of the header and the header error detection result; and
    a reallocator to merge the first and second information extracted from the header and generate a third type header, the first, second, and third type headers having different formats from each other, wherein:
    the first information includes data identification included in the header, and
    the second information includes packet data field information in the header.

2. The header processing device as claimed in claim 1, wherein the error detector is to detect the error in the header using the ECC in the header when the information corresponding to the type of the header indicates that the header is the first type header.

3. The header processing device as claimed in claim 2, wherein when the error in the header is detected, the error detector is to generate and transmit an error interrupt signal to a core processor of an electronic device including the header processing device.

4. The header processing device as claimed in claim 3, wherein when the error interrupt signal is generated, the reallocator is not to generate the third type header.

5. The header processing device as claimed in claim 1, wherein the error detector is to detect an error in each of a plurality of unit headers in the header based on the CRC checksum when the information corresponding to the type of the header indicates that the header is the second type header.

6. The header processing device as claimed in claim 5, wherein when an error in all of the unit headers in the header is detected, the error detector is to generate the error interrupt signal in a core processor of an electronic device including the header processing device.

7. The header processing device as claimed in claim 6, wherein when the error interrupt signal is generated, the reallocator is not to generate the third type header.

8. The header processing device as claimed in claim 1, wherein the controller includes:
    a finite state machine FSM to transmit at least one portion of the header and data in the packet to the error detector and the reallocator based on the information corresponding to the type of the header; and
    a header selector to generate a signal to select the first information and the second information included in the header and to provide the signal to the reallocator.

9. The header processing device as claimed in claim 8, wherein when the error in the header is not detected using the ECC in the header when the information corresponding to the type of the header indicates that the header is the first type header, the
    header selector is to generate the signal to select the first information and the second information in the header.

10. The header processing device as claimed in claim 8, wherein the second type header includes a plurality of unit headers, and wherein when the information corresponding to the type of the header indicates that the header is the second type header, the header selector is to generate the signal to select the first information and the second information in a unit header in which an error is not detected using the CRC checksum, among the plurality of unit headers in the header.

11. The header processing device as claimed in claim 1, wherein the reallocator includes:
    a first input to receive at least one piece of first information in the header and to output first information selected by the controller;
    a second input to receive at least one piece of second information in the header and to output second information selected by the controller;
    a header merger to merge the first and second information output by the first input and the second input, respectively, and to generate and output the third type header;
    a payload merger to receive data in the packet, to merge the data, and output the merged data; and
    an output to merge and output the third type header from the header merger and the merged data from the payload merger.

12. The header processing device as claimed in claim 1, wherein the first type header and the second type header are a header of D-PHY physical layer and a header of C-PHY physical layer, respectively.

13. A processor, comprising:
    a first physical layer configured to receive a first packet with a first type header including an error correction code (ECC);
    a second physical layer configured to receive a second packet with a second type header including a cyclic redundancy checking (CRC) checksum;
    a link layer configured to convert the first type header in the first packet received from the first physical layer to a third header based on a result of error detection using the ECC or the second type header in the second packet received from the second physical layer to a third type header based on a result of error detection using the CRC checksum, the first, second, and third type headers having different formats from each other, and to output data included the first packet or the second packet through parsing the third type header and data interleaving; and
    a core processor to process the data output by the link layer.

14. The processor as claimed in claim 13, wherein the link layer includes:
    a header processor to convert the first type header or the second type header to the third type header, wherein the header processor includes:
        an error detector to detect errors in the first type header using the ECC or errors in the second type header using the CRC checksum and to output a header error detection result;
        a controller to select first information and second information from the first type header or the second type header based on information corresponding to a type of header in the first packet or the second packet and the header error detection result; and
        a reallocator to merge the first and second information and to generate the third type header.

15. The processor as claimed in claim 14, wherein the reallocator includes:
    a first input to receive at least one piece of first information in the first type header and the second type header and output first information selected by the controller
    a second input to receive at least one piece of second information in the first and second type headers and output second information selected by the controller;
    a header merger to merge the first and second information output from the first and second inputs, respectively, and to generate and output the third type header;
    a payload merger to receive data in the first packet and the second packet and to merge and output the data; and
    an output to merge and output the third type header from the head merger and the data from the payload merger.

16. The processor as claimed in claim 14, wherein the controller includes:
    a Finite State Machine FSM to transmit at least one portion of a header and data in each of the first packet and the second packet to the error detector and the reallocator based on information corresponding to a type of header; and
    a header selector to generate a signal to select the first and second information in the first type header or the second type header and to provide the signal to the reallocator.

17. The processor as claimed in claim 16, wherein when the error in the first type header is not detected using the ECC in the first type header when the information corresponding to the type of the header indicates that the header is the first type header, the header selector is to generate the signal to select the first and second information in the first type header.

18. The processor as claimed in claim 16, wherein the second type header includes a plurality of unit headers, and wherein when the information corresponding to the type of the header indicates that the header is the second type header, the header selector is to generate the signal to select the first and second information in a unit header in which an error is not detected using the CRC checksum, among the plurality of unit headers in the second type header.

* * * * *